United States Patent [19]

Nakano

[11] Patent Number: 5,127,158
[45] Date of Patent: Jul. 7, 1992

[54] PROCESS FOR PRODUCING A PRINTED CIRCUIT BOARD WITH A SYNDIOTACTIC POLYSTYRENE SUPPORT

[75] Inventor: Akikazu Nakano, Osaka, Japan

[73] Assignee: Idemitsu Kosan Co., Ltd., Tokyo, Japan

[21] Appl. No.: 575,295

[22] Filed: Aug. 30, 1990

[30] Foreign Application Priority Data

Sept. 6, 1989 [JP] Japan ................................. 229305
Sept. 6, 1989 [JP] Japan ................................. 229306

[51] Int. Cl.$^5$ ......................... B05D 5/12; B28B 1/16; B32B 31/00; D21H 19/02
[52] U.S. Cl. ........................................ 29/849; 156/150; 156/233; 156/245; 156/307.7; 162/145; 162/146; 162/169; 264/86; 264/87; 264/517; 264/571; 264/112; 264/122; 264/126; 264/128; 264/129; 264/259; 264/319; 264/330; 264/332; 427/96; 427/98; 427/99
[58] Field of Search ................. 264/86, 87, 101, 517, 264/571, 518, DIG. 78, 128, 112, 122, 126, 113, 129, 319, 259, 330, 332; 162/145, 146, 169; 427/96, 99, 98; 156/150, 233, 245, 307.7; 428/901; 29/848, 849

[56] References Cited

U.S. PATENT DOCUMENTS

| 2,890,147 | 6/1959 | Pearson et al. | 264/112 X |
| 2,963,748 | 12/1960 | Young | 264/112 X |
| 3,274,328 | 9/1966 | Davis | 427/96 X |
| 3,770,571 | 11/1973 | Alsberg | 264/DIG. 59 X |
| 3,937,865 | 2/1976 | Jongetjes | 162/156 X |
| 4,191,805 | 3/1980 | Nolte | 264/87 X |
| 4,518,737 | 5/1985 | Traut | 264/122 X |
| 4,615,854 | 10/1986 | Pratt et al. | 264/122 X |
| 4,740,340 | 4/1988 | Pratt et al. | 264/112 X |
| 4,892,695 | 1/1990 | Bainbridge et al. | 264/122 X |
| 4,933,208 | 6/1990 | Dorinski | 427/96 |
| 4,952,420 | 8/1990 | Walters | 427/99 X |

FOREIGN PATENT DOCUMENTS

| 0052061 | 5/1982 | European Pat. Off. | 427/96 |
| 1290912 | 3/1969 | Fed. Rep. of Germany | 427/96 |
| 1526480 | 5/1968 | France | 427/96 |
| 20883 | 6/1973 | Japan | 264/112 |

Primary Examiner—Karen Aftergut
Attorney, Agent, or Firm—Frishauf, Holtz, Goodman & Woodward

[57] ABSTRACT

A process for producing a printed circuit board includes steps, sequentially conducted of dispersing in water or organic solvent:

(A) 95 to 20% by weight of a styrene polymer having a syndiotactic structure, (B) 5 to 80% by weight of a fibrous filler having a fiber length of 1 to 50 mm, and (C) 0.1 to 30 parts by weight of at least one of a binder and a binding fiber in proportion to 100 parts by weight of the total amount of the components (A) and (B), to make a slurry having a concentration of 0.5 to 100 g/l; separating the solids from the slurry and drying and molding them. Thereafter the solids are either subjected to melting with heating and pressure forming into the molded article, or they are impregnated with a thermoplastic resin which is then cured. Finally, a metal layer is provided on the molded article.

7 Claims, No Drawings

PROCESS FOR PRODUCING A PRINTED CIRCUIT BOARD WITH A SYNDIOTACTIC POLYSTYRENE SUPPORT

BACKGROUND OF THE INVENTION

1. Field of the Invention

The present invention relates to a process for producing a printed circuit board and the printed circuit board obtained by the process. Particularly, it relates to a process for efficiently producing a printed circuit board excellent in dielectric properties, dimensional stability and flexing properties and the printed circuit board obtained by the process.

2. Description of the Related Arts

Hitherto, composite sheets which are the combinations of thermosetting resins such as an epoxy resin, a phenol resin or an unsaturated polyester resin with materials such as paper, a glass fiber or a synthetic fiber have been widely used as insulating materials for printed circuit boards. These composite base materials are excellent in electrical insulating properties and are in increasing demand in the electric and electronic fields.

The composite base materials comprising a thermosetting resin, however, is molded with use of a solvent such as a styrene monomer and has a bad environment of molding operation, so that they are not suitable for a multi-layer printed circuit board used in the fields such as computer industry where high-speed operation is required.

As the multi-layer printed circuit board used in the fields such as computer industry where high-speed operation is required, printed circuit boards which comprise a fluorinated polyethylene resin as an insulating base material have been recently developed with great strides.

However, fluorinated polyethylene resins are very difficult to mold, so that the development molded articles of usual melt molding, specifically injection molding or extrusion molding has been investigated. Printed circuit boards comprising as a base material polyphenylene sulfide (PPS) which is a thermoplastic resin have also been researched for improving the production efficiency, but they have a problem that they have too high dielectric constant to use them as a multi-layer printed circuit board for the high-speed operation.

Thus, the present inventor has earnestly conducted researches for the development of a process for efficiently producing a printed circuit board which is excellent in dielectric properties, dimensional stability and flexing properties under a good operation environment.

As a result, the present inventors have found that a printed circuit board having the aforementioned properties can be obtained by using a composition of a styrene polymer having a syndiotactic structure (hereinafter referred to as SPS), a fibrous filler, a binder and/or a binding fiber at a predetermined ratio, molding the composition according to the principle of papermaking and finally providing a metal layer on the molded product thus obtained. The present invention has been accomplished on the basis of the finding.

SUMMARY OF THE INVENTION

That is, the present invention provides a process for producing a printed circuit board characterized in that the following steps are sequentially conducted:

(1) a step for dispersing in water and/or an organic solvent (A) 95 to 20% by weight of a styrene polymer having a high degree of syndiotactic structure, (B) 5 to 80% by weight of a fibrous filler having a fiber length of 1 to 50 mm, and (C) 0.1 to 30 parts by weight of a binder and/or a binding fiber in proportion to 100 parts by weight of the total amount of the aforementioned components (A) and (B), to make a slurry having a concentration of 0.5 to 100 g/l, (2) a sedimentation step of the dispersed solids in the slurry, (3) a step for removing water and/or an organic solvent in the slurry by filtration and drying and molding the residue, (4) a step for melting with heating and pressure forming the molded product, and (5) a step for providing a metal layer on the molded article. The present invention also provides a process for conducting (4') a step for impregnating the molded product with a thermosetting resin and curing the product in place of (4) a step for melting with heating and pressure forming the molded product.

DESCRIPTION OF PREFERRED EMBODIMENTS

First of all, the aforementioned components (A), (B) and (C) are dispersed into water and/or an organic solvent at a predetermined ratio to make a slurry. In this connection, the styrene polymer (SPS) as the component (A) has a syndiotactic structure. The syndiotactic structure means that the polymer has a stereostructure with a syndiotactic configuration, that is the stereostructure in which phenyl groups or substituted phenyl groups as side chains are located alternately at opposite directions relative to the main chain consisting of carbon-carbon bonds. The tacticity is quantitatively determined by the nuclear magnetic resonance method using carbon isotope ($^{13}$C-NMR) method. The tacticity as determined by the $^{13}$C-NMR method can be indicated in terms of proportions of structural units continuously connected to each other, i.e., a diad in which two structural units are connected to each other, a triad in which three structural units are connected to each other, or pentad in which five structural units are connected to each other. Styrene polymers having a high degree of the syndiotactic configuration of the present invention include polystyrene, poly(alkylstyrene), poly(halogenated styrene), poly(alkoxystyrene), poly(vinyl benzoate) and the hydrogenated polymers thereof and mixtures thereof, and copolymers containing the above polymers as the main component, having such a syndiotacticity that the proportion of racemic diad is at least 75% and preferably at least 85%, or the proportion of racemic pentad is at least 30% and preferably at least 50%. The aforementioned poly(alkylstyrene) includes poly(methylstyrene), poly(ethylstyrene), poly(isopropylstyrene), poly(tertbutylstyrene), poly(phenylstyrene), poly(vinylnaphthalene), poly(vilnylstyrene) and the like. The poly(halogenated styrene) includes poly(chlorostyrene), poly(bromostyrene), poly(fluorostyrene) and the like. The poly(halogenated alkylstyrene) includes poly(chloromethylstyrene) and the like, and the poly(alkoxystyrene) includes (methoxystyrene) and the like. The poly(alkoxystyrene) includes poly(methoxystyrene), poly(ethoxystyrene) and the like. Furthermore, the comonomer components of the copolymer containing these structural units include, in addition to the monomers of the above-described styrene polymers, olefinic monomers such as ethylene, propylene, butene, hexene, octene and the like; diene monomers such as butadiene, isoprene and the like; cycloolefin monomers, cyclodiene monomers, and polar vinyl monomers such as methyl methacrylate, maleic anhydride, acrylonitrile and the like.

Among these styrene polymers, the particularly preferred ones include polystyrene, poly(alkylstyrene), poly(halogenated styrene), hydrogenated polystyrene and copolymers containing these structural units.

The styrene polymers having such syndiotactic structures can be produced by, for example, polymerizing a styrene monomer (a monomer corresponding to the above styrene polymer) using a titanium compound and a condensate product of water and trialkylaluminum as a catalyst in an inert hydrocarbon or in the absence of a solvent (Japanese Patent Application Laid-Open No. 187708/1987). Further, the poly(halogenated alkylstyrene) can be prepared by the method disclosed in Japanese Patent Application Laid-Open No. 6912/1989, and the hydrogenated polymers thereof can be prepared by the method disclosed in Japanese Patent Application Laid-Open No. 178505/1989.

The styrene polymers have no particular restriction for the molecular weight and includes the ones having the weight average molecular weight of 2,000 or more, preferably 10,000 or more, particularly 50,000 or more. The molecular weight distribution is not restricted for the width, and it can be possible to apply various widths.

According to the process of the present invention, the amount of SPS as the above component (A) to be formulated is in the range of 95 to 20% by weight, preferably 90 to 30% by weight, more preferably 90 to 40% by weight in proportion to the total amount of the components (A) and (B). If the amount of SPS to be formulated is less than 20% by weight, the fibrous filler as the component (B) is coated only insufficiently for the expression of the anticipated physical properties such as heat resistance, mechanical strength or surface smoothness. Further, the composition has bad fluidity on molding, and the upper half of a mold will not fit to the lower half due to the high stiffness of the composition, so that it is apprehended that the mold is broken. On the other hand, if the amount of the component (A) exceeds 95% by weight, heat resistance and mechanical strength will not improved.

According to the process of the present invention, SPS as the above-described component (A) is not restricted particularly for its form, and a variety of forms can be used. The component (A) is preferably used in the form of powder having a bulk density of 0.05 to 1.0 g/cm$^3$, more preferably 0.10 to 0.95 g/cm$^3$, and/or in the form of a fibrous molded product having a fiber diameter of 0.01 to 500 μm. In this connection, when the SPS is used in the form of powder having a bulk density in the range of less than 0.05 g/cm$^3$ or more than 1.0 g/cm$^3$, a homogeneous slurry dispersion will not sometimes be obtained on the production of a molded product according to the process of the present invention.

Next, the fibrous filler used as the component (B) in the process of the present invention includes various fillers, preferably such as ceramic fibers such as glass fiber, asbestos fiber, carbon fiber, gypsum, potassium titanate, magnesium sulfate, magnesium oxide and the like; metal fibers such as those made of copper, aluminum, steel and the like; whiskers such as those made of boron, alumina, silica, silicon carbide and the like; organic synthetic fibers such as an all aromatic polyamide fiber, a polyimide fiber, and aramid fiber and the like; and natural plant fibers such as silk, flax and the like. These fibers are used alone or in combination of the two or more.

According to the process of the present invention, the amount of the fibrous filler as the aforementioned component (B) to be formulated is in the range of 5 to 80% by weight, preferably 10 to 70% by weight, more preferably 10 to 60% by weight in proportion to the total amount of the components (A) and (B). The fibrous fillers having a fiber length in the range of 1 to 50 mm, preferably 5 to 30 mm are used. If the fibrous filler has a fiber length less than 1 mm, it is not so improved in mechanical strength. On the other hand, if it has a fiber length exceeding 50 mm, it is dispersed only insufficiently in a slurry on the production of a molded product according to the process of the present invention.

The component (C) used in the process of the present invention is a binder and a binding fiber, and the either or both of the two are used. The binder includes various binders such as natural starch (particularly natural maize starch), a phosphate ester of starch (RETAMIL AP or RETAPOND AP type), a carboxymethylated starch, a starch oxide, an enzyme treated starch (for example, a linear polymeric α-amylose having a glycol unit distribution in the range of 50 to 3,000), a hydroxymethylated starch, a carboxymethylcellulose for industrial use (sodium chloride: 5 to 30%; substitution degree: 0.7 to 0.8), an aqueous dispersion having a concentration of 40 to 55% of a polymer comprising 87 to 90 parts by weight of an ethyl acrylate unit, 1 to 8 parts by weight of an acrylonitrile unit, 1 to 6 parts by weight of an N-methylolacrylamide unit and 1 to 6 parts by weight of an acrylic acid unit, an aqueous dispersion of a concentration of 40 to 55% of a polymer comprising 60 to 75 parts by weight of an ethyl acrylate unit, 5 to 15 parts by weight of an acrylonitrile unit, 10 to 20 parts by weight of a butyl acrylate unit and 1 to 6 parts by weight of an N-methylolacrylamide unit, an aqueous dispersion having a concentration of 40 to 55% of a polymer comprising 60 to 65 parts by weight of a butadiene unit, 35 to 40 parts by weight of a acrylonitrile unit and 1 to 7 parts by weight of a methacrylic acid unit, a polymer comprising 38 to 50 parts by weight of a styrene unit, 47 to 59 parts by weight of a butadiene unit and 1 to 6 parts by weight of a methacrylamide unit, an aqueous dispersion having a concentration of 40 to 55% of a polymer comprising 53 to 65 parts by weight of a styrene unit, 32 to 44 parts by weight of a butadiene unit and 1 to 6 parts by weight of a methacrylamide unit, polyvinyl alcohol, casein, carboxymethylcellulose, gelatin, methylethylcellulose, an aqueous dispersion having a concentration of 40 to 55% of a carboxylated styrene-butadiene latex, an alginic acid salt, dextrin, an aqueous dispersion having a concentration of 40 to 55% of a copolymer comprising vinylidene chloride as a base, an ethylene-vinyl acetate copolymer and the like. These binders are used alone or in combination of the two or more appropriately. Among them, latexes (an acrylic type or a styrene-butadiene type), starches, particularly a natural starch (obtained from potato) and a starch having a linear polymer component such as maize natural starch (having 100 to 6,000 anhydroglucose units per molecule in the linear polymer), that is a starch comprising 50 to 6,000 anhydroglucose units per amylose medium-molecule, or a chemically or enzymatically treated starch having 50 to 3 000 anhydroglucose units per molecule are preferred. The binder ensures the bond of the components such as thermoplastic plastic sheets and strengthens the physical properties.

The binding fibers include various fibers. The term binding fiber means a fiber such as a cellulose fiber or a polyolefin pulp fibril (see U.S. Pat. No. 2,481,707) which can appropriately bonding the other components of the composition. Specific examples of the binding fibers include a bleached softwood kraft pulp, a half bleached softwood kraft pulp, a non-bleached softweed kraft pulp, a bleached softwood sulfite pulp, a non-bleached softwood sulfite pulp, a bleached hardwood kraft pulp, a half bleached hardwood kraft pulp, a non-bleached mechanical pulp, a bleached mechanical pulp, a polyvinyl alcohol fiber, a rayon fiber, a recovered fiber, a polyolefin pulp fibril, a cellulose fiber and the like.

In the process of the present invention, the aforementioned binder and/or binding fiber is used as the component (C) and is formulated in an amount of 0.1 to 30 parts by weight per 100 parts by weight of the total amount of the components (A) and (B). If the component (C) is formulated in an amount less than 0.1 part by weight, the composition molded into sheet does not exhibit a satisfactory mechanical strength for stretching it with a papermaking machine. If the amount of the component (C) exceeds 30 parts by weight, the heat resistance is undesirably decreased.

The process for dispersing the components to make a slurry is conducted by adding the aforementioned components (A), (B) and (C) to water, an organic solvent (specifically an alcohol, a hydrocarbon, a ketone and the like) or a mixture thereof in pre-determined ratio and adjusting the concentrations to 0.5 to 100 g/l. A dispersing agent and a sizing agent may be added, if necessary, in order to improve the dispersibility and to improve the adhesive properties of the fibrous filler and the SPS, respectively. A flame-retardant and a flame-retardant aid are also added according to necessity. Particularly, the flame-retardant aid is added so that the dielectric constant will not be increased. It is desirable that these additives be added in the amounts not more than 40 parts by weight for the flame-retardant and 15 parts by weight for the flame-retardant aid per 100 parts by weight of the total weight of the components (A) and (B). Further, usual additives such as an antioxidant, a nucleating agent, an antistatic agent, a thermoplastic resin, an elastomer and the like.

The SPS as the component (A) used is not particularly restricted in form and may have a form of powder, fiber or beads which can be suspended in water or an organic solvent. The SPS having various forms may be used in combination thereof. If the SPS molded product is in the form of fiber, it has preferably a fiber length of 0.1 mm to 30 mm and a fiber diameter of 0.1 μm to 500 μm. The fibrous molded product can be obtained by a dry spinning method, a wet spinning method, a melt spinning method, a melt blow spinning method, a flash spinning method or the like. The product may be the one which has been heated and stretched again on or after spinning.

Likewise, it is sufficient that the component (C), the dispersion agent and the sizing agent can be suspended into water or an organic solvent.

The sequence of the addition of these components is not critical, but it is desirable to add first a sizing agent or a surfactant and a dispersing agent and then the components (A), (B) and (C) in this sequence or (B), (A) and (C) in this sequence.

In addition, the aforementioned dispersing agent, the sizing agent and the thermoplastic resin specifically include the followings.

First of all, the dispersing agent includes the following surfactants (1) to (4):

(1) Anionic surfactant

A sodium fatty acid soap, a potassium fatty acid soap; an alkyl sulfate salt such as a sodium alkylsulfate salt, a sodium alkylethersulfate salt and the like;

a sodium salt of an ethylhexylalkylsulfate;

a sodium salt of dodecylbenzene sulfonate, dodecylbenzene sulfonic acid, a sodium acylmethyltaurate, sodium lauroylmethyltaurate, and sodium dioctylsulfonesuccinate.

(2) Cationic surfactant
Amine type

Octadecylamine acetate, tetradecylamine acetate, a tallow alkylpropylenediamine acetate.

Methyl type

Octadecyltrimethylammonium chloride, an alkyltrimethylammonium chloride dodecyltrimethylammonium chloride, hexadecyltrimethylammonium chloride, behenyltrimethylammonium chloride, an alkylimidazoline quaternary salt.

Benzyl type

An alkyldimethylbenzylammonium chloride, tetradecyldimethylbenzylammonium chloride.

Other types

Dioleyldimethylammonium chloride, a polyoxyethylenedodecylmonomethylammonium chloride, oxyethylenedodecylamine, a polyoxyethylenedodecylamine, a polyoxyethylenealkylamine, a polyoxyethyleneoctadecylamine, a polyoxyethylenealkylpropylenediamine, a 1-hydroxyethyl-2alkylimidazoline quaternary salt, an alkylisoquinolinium bromide, a polymeric amine.

(3) Nonionic surfactant
Ether type

A polyoxyethylene oleylether, a polyoxyethylene cetylether, a polyoxyethylene stearylether, a polyoxYethylene laurylether, a polyoxyethylene tridecylether, a polyoxyethylene alkylether.

Alkylphenol type

A polyoxyethylene nonylphenylether, a polyoxyethylene octylphenylether.

Ester type

A polyoxyethylene monolaurate, a polyoxyethylene monostearate, a polyoxyethylene monooleate.

Sorbitan ester type

Sorbitan monolaurate, sorbitan monstearate, sorbitan monopalmitate, sorbitan monooleate, sorbitan sesquioleate, sorbitan trioleate.

Sorbitan ester ether type

A polyoxyethylene sorbitan monolaurate, a polyoxyethylene sorbitan monopalmitate, a polyoxyethylene sorbitan monostearate, a polyoxyethylene sorbitan monooleate.

Other types

An oxyethylene-oxypropylene block polymer, an alkylalkylolamide, lauric acid diethanolamide, coconut oil fatty acid diethanolamide, oleic acid diethanolamide, tallow fatty acid diethanolamide, glyceryl monostearate, a polyglycerol fatty acid ester, a polyoxyethylene distearate.

Amphoteric surfactant

A dimethylalkyl betaine, a dimethylalkyllauryl betaine, an alkylglycine.

Specific examples of the sizing agent include the following coupling agents (1) and (2):

(1) Silane coupling agent

There are mentioned triethoxysilane, vinyl tris($\beta$-methoxyethoxy)silane, $\gamma$-methacryloxypropyltrimethoxysilane, $\gamma$glycidoxypropyltrimethoxysilane, $\gamma$-(1,1-epoxycyclohexyl)-ethyltriethoxysilane. N-$\beta$-(aminoethyl)-$\gamma$-aminopropyl-trimethoxysilane, N-$\beta$-(aminoethyl)-$\gamma$-aminopropylmethyl-dimethoxysilane, $\gamma$-aminopropyltriethoxysilane, N-phenyl-$\gamma$-aminopropyltrimethoxysilane, $\gamma$-mercaptopropyl-trimethoxysilane, $\gamma$-chloropropyltrimethoxysilane, $\gamma$-aminopropyltrimethoxysilane, $\gamma$-aminopropyl-trys(2-methoxyethoxy)silane. N-methyl-$\gamma$-aminopropyltrimethoxysilane, N-vinylbenzyl-$\gamma$-aminopropyltriethoxysilane, triaminopropyltrimethoxysilane, 3-ureidopropyltrimethoxysilane, 3-(4,5-dihydroimidazole)propyltriethoxysilane, hexamethyldisilazane, N,O-(bistrimethylsilyl)amide, N,N-bis(trimethylsilyl)urea and the like. Among them, aminosilanes such as $\gamma$-aminopropyltriethoxysilane, N-$\beta$-(aminoethyl)-$\gamma$-aminopropyltrimethoxysilane, $\gamma$-glycidoxypropyltrimethoxysilane, $\beta$-(3, 4-epoxycyclohexyl)ethyl-trimethoxysilane and the like, and epoxysilanes are preferred.

(2) Titanate coupling agent

There are mentioned isopropyltriisostearoyl titanate, isopropyltridodecylbenzenesulfonyl titanate, isopropyltris(dioctylpyrophosphate) titanate, tetraisopropylbis(-dioctylphosphite) titanate, tetraoctylbis(ditridecylphosphite) titanate, tetra(1,1-diallyloxymethyl-1-butyl)-bis(ditridecyl)phosphite titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropyltri(dioctylphosphate) titanate, isopropyltricumylphenyl titanate, isopropyltri(Namidoethyl, aminoethyl) titanate, dicumylphenyloxyacetate titanate, diisostearoylethylene titanate and the like. Among them, isopropyltri(N-amidoethyl, aminoethyl) titanate are preferred.

As the flame-retardant, there are mentioned various types of flame-retardants, among which halogen flame-retardants and phosphate flame-retardants are praticularly preferred. The halogen flame-retardants include, for example, tetrabromobisphenol A, tetrabromophthalic anhydride, hexabromobenzene, tribromophenyl allyl ether, pentabromotoluene, pentabromophenol, tribromophenyl 2,3-dibromopropyl ether, tris(2,3-dibromopropyl)phosphate, tris(2-chloro-3-bromopropyl)phosphate, octabromodiphenyl ether, decabromodiphenyl ether, octabromobiphenyl, pentachloropentacyclodecane, hexabromocyclododecane, hexachlorobenzene, pentachlorortoluene, hexabromobiphenyl, decabromobiphenyl, decabromobiphenyl oxide, tetrabromobutane, decabromodiphenyl ether, hexabromodiphenyl ether, ethylenebis(tetrabromophthalimide), tetrachlorobisphenol A, tetrabromobisphenol A, tetrachlorobisphenol A or an oligomer of tetrabromobisphenol A, a halogenated polycarbonate oligomer such as brominated polycarbonate oligomer or the like, a halogenated epoxy compound, polychlorostyrene, a halogenated polystyrene such as polytribromostyrene or the like, poly(dibromophenylene oxide), bis(tribromophenoxy)ethane or the like.

On the other hand, the phosphate flame-retardants include, for example, ammonium phosphate, tricresyl phosphate, triethyl phosphate, an acid phosphate, triphenylphosphine oxide and the like.

Among them, a polytribromostyrene, a poly(dibromophenylene oxide), decabromodiphenyl ether, bis(tribromophenoxy)ethane, ethylenebis(tetrabromophthalimide), tetrabromobisphenol A and the brominated polycarbonate oligomer are particularly preferred as the flame-retardant.

The flame-retardant aids which can be used together with the flame-retardants include various types of flame-retardant aids, for example antimony flame-retardant aids such as antimony trioxide, antimony pentoxide, sodium antimonate, antimony metal, antimony trichloride, antimony pentachloride, antimony trisulfide, antimony pentasulfide and the like. There can be mentioned in addition to these flame-retardant aids zinc borate, barium metaborate, zirconiua oxide and the like. Among them, antimony trioxide is particularly preferred.

Further, in the present invention a tetrafluoroethylene polymer can be incorporated in order to prevent the melt dropping. Specific examples of the tetrafluoroethylene polymer include in addition to the tetrafluoroethylene homopolymer (polytetrafluoroethylene) a copolymer of tetrafluoroethylene and hexafluoropropylene, a tetrafluoroethylene copolymer containing a small amount of a copolymerizable ethylenically unsaturated monomer and the like. The tetrafluoroethylene polymer having a fluorine content of 65 to 76% by weight, preferably 70 to 76% by weight is used.

Further, as the thermoplastic resin, there is mentioned the one which is compatible or non-compatible with the SPS as the component (A). For example, a styrene polymer having an atactic structure, a styrene polymer having an isotactic structure, a polyphenyl ether and the like are easily compatible with SPS, and thus a molded product having excellent mechanical properties. Particularly, a polyphenyl ether having a polar group such as maleic anhydride has a remarkable effect for improving the adhesiveness between the fibrous filler and the SPS and is preferred. The non-compatible resins include, for example, a polyolefin such as polyethylene, polypropylene, polybutene, polypentene and the like; a polyester such as polybutylene terephthalate, polyethylene naphthalate and the like; a polyamide such as nylon 6, nylon 6,6 and the like; a polythioether such as a polyphenylene sulfide and the like; a polycarbonate, a polyallylate, a polysulfone, a polyether ether ketone, a polyether sulfone, a polyimide, a halogenated vinyl polymer, an acrylic polymer such as polymethyl methacrylate and the like, polyvinyl alcohol, a styrene-maleic anhydride copolymer (SMA) and all but the aforementioned compatible resins. There are also mentioned crosslinked resins containing the aforementioned compatible resins. The sedimentation step of the process of the present invention is a step for adding, if necessary, an agglomerating agent to the suspension which has been subjected to dispersion to make a slurry in the abovedescribed step (1), agglomerating particles and sedimenting the resultant solid. The agglomerated particles (solid) sediment by its dead load. The agglomerating agent is usually added in an amount of 0.1 to 0.5 g/l, but it is not always necessary if the particles in the suspension have a large size and sediment by their dead load. In this connection, the agglomerating agent to be used in this step includes aluminum sulfate; a polyaluminum chloride (aluminum hydroxychloride); sodium and potassium aluminate; a blend of a polyacrylic acid and a polyacrylamide in the form of a 5 to 30% (weight/volume) aqueous solution; a polyethylenimine in the form of a 2 to 50% (weight/volume) aqueous solution; a copolymer of acrylamide and β-methacryloxyethyltrimethylammonium methylsulfate; polyamine-epichlorohydrin and diamine-propylmethylamine resins in the form of a 2 to 50% aqueous solution; a polyamide-epichlorohydrin resin which is in the form of a 2 to 50% aqueous solution and is made of epichlorohydrin, adipic acid, caprolactam, diethylenetriamine and/or ethylenediamine; a polyamide-polyamine-epichlorohydrin resin which is in the form of a 2 to 50% aqueous solution and is made of epichlorohydrin, a dimethyl ester, edipic acid and diethylenetriamine; a polyamide-epichlorohydrin resin which is made of epichlorohydrin, diethylenetriamine, adipic acid and ethylenediamine; a polyamide-epichlorohydrin which is in the form of a 2 to 50% aqueous solution and is made of adipic acid. diethylenetriamine and a blend of epichlorohydrin and dimethylamine; a cationic polyamide-polyamine resin which is made of triethylenetriamine; a condensation product of an aromatic sulfonic acid and formaldehyde; aluminum acetate; aluminum formate; a blend of aluminum acetate, sulfate and formate; aluminum chloride; and a cationic starch.

Next, the filtration, dehydration and drying step (3) in the process of the present invention is a step for removing a liquid phase for the purpose of obtaining only the solid sediment. The operation in this step is conducted by passing the suspension through a filter fabric or a porous screen or a screen having a network. In this connection, mechanical operations such as compression or suction or a thermal action such as blowing of hot air may be conducted in combination, and most of the liquid phase can be removed efficiently by the operation. Other drying methods such as the irradiation of infrared or high frequency waves may be conducted. If the liquid phase can be removed only by filtration, the aforementioned drying is not always required. The molded product in the shape of sheet or the like is obtained by sufficiently removing the liquid phase.

According to the process of the present invention, the melting and molding step (4) or the impregnation and curing step (4') is conducted after the aforementioned steps (1)–(3).

The melting and molding step is a step for melting with heating a molded product in the shape of a sheet which has been dehydrated and dried at a temperature from the melting point of SPS to the melting point +80° C. or at a temperature not more than 350° C. and next pressure forming the molded product. If the step is completed, the SPS resin in the molded product in the shape of sheet is melted, so that the bond of the SPS resin and the fibrous filler is strengthened for obtaining a formed product having a larger mechanical strength. The cooling after melting may be conducted at a temperature from room temperature to the melting point of the SPS, preferably 200° C. or less. Pressure forming may be conducted by a usual method, for example at a pressure of 10 to 200 kg/cm$^2$, preferably 30 to 150 kg/cm$^2$ with a press or a roll.

On the other hand, the impregnation and curing step (4') which can be conducted in place of the above-described melting and forming step (4) is a step for impregnating the molded product (sheet) obtained in the step (3) with the thermosetting resin and then curing the resin to improve the strength of the sheet. The curing may be conducted under pressure. The impregnation of the sheet with the thermosetting resin is not critical and is usually conducted by some methods such as a method of applying the resin to the sheet with a roller, a brush or the like, a method of dipping the sheet into a vanish prepared by incorporating the thermosetting resin with a curing agent, additives and a solvent and then curing the sheet, a method of applying a varnish that a curing agent has been incorporated into a solvent-free liquid thermosetting resin to the sheet or dipping the sheet into the varnish or the like. The amount of the thermosetting resin to be impregnated may be appropriately determined, and it is preferably in the range of 0.1 to 50 parts by weight per 100 parts by weight of the total amount of the components (A) and (B).

As the above-described thermosetting resin, there can be used a variety of resins such as an unsaturated polyester resin (such as an ortho-phthalic acid, isophthalic acid, terephthalic acid, alicyclic unsaturated fatty acid, halogen-containing acid, aliphatic saturated acid, bisphenol, halogen-containing bisphenol, molecular terminal (meth)acrylic acid or vinyl ester type), an epoxy resin (such as a phenolic glycidyl ether, alcoholic glycidyl ether, glycidyl ester, glycidylamine or mixed type or an alicyclic type), a phenol resin, a urea resin, a melamine resin, a diallyl phthalate resin and the like. Among them, the epoxy resin is preferred. When the epoxy resin is used, an aliphatic polyamine, an amidamine, a polyamide, an aromatic polyamine, an acid anhydride, a catalytic curing agent, a polymercaptan, a polysulfide and the like can be used in combination.

The process of the present invention conducts the step of providing a metal layer on the molded article (5) after the above-described step (4) or (4'). The metal layer can be provided on the molded article by the methods such as etching a laminated metal foil (subtractive method), directly metal plating a circuit (additive method), laminating and foil stamping a circuit foil, vacuum deposition or sputtering. A circuit foil may be placed in a mold used for molding and bonded to the formed product at the same time as the molding.

The metal layer has a thickness in the order from 0.1 μm to 1 mm, which may be appropriately selected according to the necessity. The thickness of the insulating base material may be selected appropriately according to the necessity with a preferred one described in JIS standard.

The metal constituting the metal layer is preferably selected from copper, nickel, aluminum, tin, gold, silver, zinc and the like. When the metal foil is bonded to the formed product, an adhesive, preferably a thermosetting adhesive having heat resistance such as an epoxy resin is used.

The process of the present invention proceeds by conducting sequentially the aforementioned steps, and the steps may be conducted continuously or batchwise.

A printed circuit board obtained by the process of the present invention has a thickness of 0.01 to 5 mm, and a dielectric constant of preferably 3.5 or less.

As described above, the printed circuit board obtained by the process of the present invention is excellent in impact resistance, heat resistance and mechanical strength and has a good size stability and flexibility as well as an excellent surface smoothness. Particularly, the printed circuit board is most suitable for a multi-layer printed circuit board used in fields where high-speed operation is required because of its excellent dielectric properties. It also has an advantage of reducing the production cost because of its excellent molding properties.

Thus, the printed circuit board of the present invention is expected to have a wide and effective utility in electric and electronic fields.

The present invention is further explained in detail with reference to Examples and Comparative Examples.

PRODUCTION EXAMPLE 1

(1) Preparation of Contact Product of Trimethylaluminum and Water

To 200 ml of toluene was 47.4 ml (492 mmole) of trimethylaluminum followed by 35.5 g (142 mmold) of copper sulfate pentahydrate ($CuSO_4 \cdot 5H_2O$), and the mixture was reacted at 20° C. for 24 hours. After the reaction was completed, toluene as the solvent was removed by filtration to give 12.4 g of methylaluminoxane as a contact product.

(2) Production of SPS

In a reaction vessel having an internal volume of 2 liters were charged 1 L (L=liter) of a purified styrene, 7.5 mmole calculated as an aluminum atom of the contact product obtained in the above (1), 7.5 mmole of triisobutylaluminum, 0.038 mmole of pentamethylcyclopentadienyl-titanium trimethoxide, and the mixture was polymerized at 90° C. for 5 hours.

After the reaction was completed, a methanolic solution of sodium hydroxide was added to the reaction mixture to decompose and remove the catalyst components. The residue was washed repeatedly with methanol and dried to give 466 g of a powder of a styrene polymer (polystyrene). When the polymer was evaluated by gel permeation chromatography with 1,2,4-trichlorobenzene as a solvent at 135° C., it had a weight average molecular weight of 290,000 and a ratio of weight average molecular weight/number average molecular weight of 2.72. The polymer was confirmed to be a polystyrene having a syndiotactic structure by the measurements of melting point and $^{13}$C-NMR.

EXAMPLE 1

To 10 L of water containing 2 g of an amine type cationic dispersing agent and 10 g of γ-aminopropyltriethoxysilane was added with vigorous stirring 300 g of a glass fiber having a length of 6 mm and a fiber diameter of 9 μm. Next, 100 g of a synthetic polyethylene pulp was added with stirring to the mixture. When the glass fiber and the polyethylene pulp had been dispersed properly, 600 g of a SPS powder prepared in Production Example 1 and having a bulk density of 0.2 g/cm$^3$ was added and 100 g of a styrenebutadiene binder was successively added. After 20 g of anhydrous aluminum sulfate as an agglomerating agent was further added to the mixture with continuous stirring, the mixture was diluted to a total amount of a solution of 100 L to ensure that the solution has a solid content of about 10 g/l. The solution was passed through a screen having a network to remove water by filtration, and the residue was dried to give a sheet having an apparent amount of 600 g/m$^2$.

The above-described sheet was pre-heated in an infrared heater at 300° C. for 3 minutes, then placed in a mold at a temperature of 180° C. and pressure molded at a pressure of 80 kg/cm$^2$ and a dwell for 3 minutes to give a molded product having a thickness of 1.2 mm. The appearance of the molded product thus obtained was evaluated visually for the quality of the embossing of the glass fiber.

Next, a copper foil for a printed circuit board having a thickness of 70 μm to which an epoxy adhesive had been applied was laminated to make a copper foil laminated printed circuit board. The dielectric properties were measured with the copper foil laminated printed circuit board according to JIS-C-6481. The coefficient of size variation was measured after the above-described molded product had been further heated in an oven at 150° C. for 30 minutes. The coefficient of size variation was calculated as follows:

First, the variation of the size of the above-described molded product (plate) before and after thermal treatment was measured by the following procedures. A point a is provided on the plate. A line is drawn through the point a parallel to one side of the plate, and a point b is provided on the line at a distance of 50 mm from the point a. Another line is drawn through the point a parallel to another side of the plate, and a point c is provided on the line at a distance of 50 mm from the point a. In this connection, the lines ab and the line ac are rectangular.

The size variations at the lines ab and ac and the point a before and after thermal treatment was calculated from the following equations:

*Variation of distance between a and b*
$(\%) = |b_2 - b_1|/b_1 \times 100.$

*Variation of distance between a and c*
$(\%) = |c_2 - c_1|/c_1 \times 100.$

*Variation of thickness at* $a = |h_2 - h_1|/h_1 \times 100.$ wherein $b_1$: the distance between a and b before thermal treatment, $c_1$: the distance between a and c before thermal treatment, $h_1$: the thickness at the point a before thermal treatment, $b_2$: the distance between a and b after thermal treatment, $c_2$: the distance between a and c after thermal treatment, $h_2$: the thickness at the point a after thermal treatment.

The formulations of components are shown in Table 1, and the results of the measurements are shown in Table 2.

PRODUCTION EXAMPLE 2

Production of SPS

In a reaction vessel having an internal volume of 2 liters were charged 1 L of a purified styrene, 7.5 mmole calculated as an aluminum atom of the contact product obtained in the above (1), 7.5 mmole of triisobutylaluminum and 0.038 mmole of pentamethylcyclopentadienyl-titanium trimethoxide, and the mixture was polymerized at 70° C. for 3 hours. After the reaction was completed, a methanolic solution of sodium hydroxide was added to the reaction mixture to decompose and remove the catalyst components. The residue was washed repeatedly with methanol and dried to give 580 g of a polymer. When the polymer was evaluated by gel permeation chromatography with 1,2,4-trichlorobenzene as a solvent at 130° C., it had a weight average molecular weight of 592,000 and a ratio of weight average molecular weight/number average molecular weight of 2.81. The polymer was confirmed to be a polystyrene having a syndiotactic structure (SPS) by the measurements of melting point and $^{13}$C-NMR.

PRODUCTION EXAMPLE 3

Production of SPS

In a reaction vessel having an internal volume of 2 liters were charged 1 L of a purified styrene, 5 mmole calculated as an aluminum atom of the contact product obtained in the above (1), 5 mmole of triisobutylaluminum and 0.025 mmole of pentamethylcyclopentadienyltitanium trimethoxide, and the mixture was polymerized at 70° C. for 5 hours. After the reaction was completed, a methanolic solution of sodium hydroxide was added to the reaction mixture to decompose and remove the catalyst components. The residue was washed repeatedly with methanol and dried to give 477 g. of a polymer. When the polymer was evaluated by gel permeation chromatography with 1,2,4-trichlorobenzene as a solvent at 130° C., it had a weight average molecular weight of 802,000 and a ratio of weight average molecular weight/number average molecular weight of 2.24. The polymer was confirmed to be a polystyrene having a syndiotactic structure (SPS) by the measurements of melting point and $^{13}$C-NMR.

EXAMPLES 2 TO 7, 11, 12 AND COMPARATIVE EXAMPLES 1 TO 6

The procedure of Example 1 was repeated with the exception that the components shown in Table 1 were formulated. The results are shown in Table 2. In this connection, the SPS's of Production Examples 2 and 3 are used in Examples 6 and 7, respectively.

PRODUCTION EXAMPLE 4

To 100 parts by weight of SPS obtained in Production Example 1 were added 0.7 part by weight of bis(2,4-di-t-butylphenyl)pentaerythritol diphosphite and 0.1 part by weight of 2,6-di-t-butyl-4-methylphenol, and the mixture was blended with a Henschel mixer. The mixture was subjected to melt spinning with a single screw extruder at a cylinder temperature of 300° C. and then to cutting to give staples having a fiber length/fiber diameter ratio of 5 mm/10 μm, 10 mm/1 μm and 30 mm/400 μm, respectively.

EXAMPLES 8 to 10

The procedure of Example 1 was repeated with the exception that the SPS staples obtained in Production Example 4 were used. The results are shown in Table 2.

EXAMPLES 13 TO 15 AND COMPARATIVE EXAMPLE 7

To 10 L of water containing 2 g of an amine type cationic dispersing agent and 10 g of γ-aminopropyltriethoxysilane was added with vigorous stirring 300 g of a glass fiber having a length of 6 mm and a fiber diameter of 10 μm. Next, 100 g of a synthetic polyethylene pulp was added with stirring to the mixture. When the glass fiber and the polyethylene pulp had been dispersed properly, 600 g of one of the SPS staples prepared in Production Example 4 was added and 100 g of a styrene-butadiene binder was successively added. After 20 g of anhydrous aluminum sulfate as an agglomerating agent was further added to the mixture with continuous stirring, the mixture was diluted to a total amount of a solution of 100 L to ensure that the solution has a solid content of about 10 g/l. The solution was passed through a screen having a network to remove water by filtration, and the residue was dried to give a sheet having an apparent amount of 600 g/m$^2$.

The above-described sheet was dipped in an alcoholic glycidyl epoxy resin and dried to impregnate 15 parts by weight (based on 100 parts by weight of the sheet) of the resin into the sheet. The sheet was further cured by heating to give a base material for a printed circuit board. The folding test of the base material was conducted by hand.

A copper foil for a printed circuit board having a thickness of 70 μm to which an epoxy adhesive had been applied was laminated on the above molded product to make a copper foil laminated printed circuit board. The dielectric properties were measured with the copper foil laminated printed circuit board according to JIS-C-6481.

The staples used are shown in Table 3, and the results of the measurement are shown in Table 4.

EXAMPLE 16

The procedure of Example 1 was repeated to give a molded product having a thickness of 5.0 mm instead of a thickness of 1.2 mm.

The test pieces for the flexural test and the Izod test were cut out, the flexural strength; the heat distortion temperature and the Izod impact were measured according to JIS-K-7203, JIS-K-7207 and JIS-K-7110, respectively. The appearance of the molded product was evaluated visually for the quality of the embossing of the glass fiber. The result are shown in Table 6.

EXAMPLES 17 TO 22 AND COMPARATIVE EXAMPLES 8 TO 12

The procedure of Example 16 was repeated with the exception that the components were formulated as shown in Table 5. The results are shown in Table 6. In this connection, the SPS of Production Examples 2 or 3 was used in Example 21 or 22, respectively.

EXAMPLES 23 TO 25

The procedure of Example 16 was repeated with exception that the SPS staple obtained in Production Example 4 was used. The results are shown in Table 6.

EXAMPLES 26 AND 27 AND COMPARATIVE EXAMPLES 13 AND 14

The sheet obtained in Example 16 was melt pressed with a pressing machine at a temperature of 300° C. and then cold pressed at a cold press at a temperature of 80° C. to give a sheet.

The above-described sheet was pre-heated in an infrared heater at 300° C. for 3 minutes, then placed in a mold at a temperature of 180° C. and pressure molded at a pressure of 80 kg/cm$^2$ and a dwell for 3 minutes to give molded product having a thickness of 5.0 mm. The test pieces for the flexural test and the Izod test were cut out, the flexural strength, the heat distortion temperature and the Izod impact were measured according to JIS-K-7203, JIS-K-7207 and JIS-k7110, respectively. The appearance of the molded product was evaluated visually for the quality of the embossing of the glass fiber. The results are shown in Table 6.

EXAMPLES 28 AND 29

To 10 L of water containing 2 g of an amine type cationic dispersing agent and 10 g of γ-aminopropyltriethoxysilane was added with vigorous stirring 300 g of a glass fiber having a length of 6 mm and a fiber diameter of 9 μm. Next, 100 g of a synthetic polyethylene pulp was added with stirring to the mixture. When the glass fiber and the polyethylene pulp had been dispersed properly, 600 g of a SPS powder prepared in Production Example 1 and having a bulk density of 0.2 g/cm$^3$, 138 grams of flame retardant shown in Table 7 and 36 grams of antimony trioxide were added and 100 g of a styrene-butadiene binder was successively added. After 20 g of anhydrous aluminum sulfate as an agglomerating agent was further added to the mixture with continuous stirring, the mixture was diluted to a total amount of a solution of 100 L to ensure that the solution has a solid content of about 10 g/l. The solution was passed through a screen having a network to remove water by filtration, and the residue was dried to give a sheet having an apparent amount of 600 g/m$^2$.

The above-described sheet was pre-heated in an infrared heater at 300° C. for 3 minutes, then placed in a mold at a temperature of 180° C. and pressure molded at a pressure of 80 kg/cm$^2$ and a dwell for 3 minutes to give a molded product having a thickness of 1.2 mm. The appearance of the molded product thus obtained was evaluated visually for the quality of the embossing of the glass fiber.

Next, a copper foil for a printed circuit board having a thickness of 70 μm to which an epoxy adhesive had been applied was laminated to make a copper foil laminated printed circuit board. The same measurement as in Example 1 was carried out on the copper foil laminated printed circuit board.

The formulations of components are shown in Table 7, and the results of the measurements are shown in Table 8.

TABLE 1

| No. | SPS Density (g/cm$^3$) | SPS Loads (wt %) | Fibrous filler Kind | Fibrous filler Length (mm) | Fibrous filler Diameter (μm) | Fibrous filler Loads (wt %) | Binder Styrene-butadiene type (part by weight)*3 | Binding fiber Synthetic polyethylene pulp (part by weight)*3 | Agglomerating agent Aluminum sulfate concn. (g/l) | Dispersing agent Amine type cation concn. (g/l) | Coupling agent γ-Aminopropyltriethoxysilane concn. (g/l) | solid concentration concn. (g/l) |
|---|---|---|---|---|---|---|---|---|---|---|---|---|
| Example 1 | 0.2 | 66.7 | GF*2 | 6 | 13 | 33.3 | 11 | 11 | 0.2 | 0.02 | 0.1 | 10.2 |
| Example 2 | 0.2 | 90.0 | GF | 6 | 13 | 10.0 | 11 | 11 | 0.2 | 0.02 | 0.1 | 10.2 |
| Example 3 | 0.2 | 50.0 | GF | 6 | 13 | 50.0 | 11 | 11 | 0.2 | 0.02 | 0.1 | 10.2 |
| Example 4 | 0.2 | 70.0 | GF | 2 | 6 | 30.0 | 20 | — | 0.2 | 0.02 | 0.1 | 10.2 |
| Example 5 | 0.2 | 70.0 | GF | 6 | 13 | 30.0 | 11 | 11 | 0.2 | 0.02 | 0.1 | 10.2 |
| Example 6 | 0.4 | 70.0 | GF | 6 | 13 | 30.0 | 11 | 11 | 0.2 | 0.02 | 0.1 | 10.2 |
| Example 7 | 0.6 | 70.0 | GF | 6 | 13 | 30.0 | 11 | 11 | 0.2 | 0.02 | 0.1 | 10.2 |
| Comparative Example 1 | 0.2 | 98.0 | GF | 2 | 6 | 2.0 | 20 | — | 0.2 | 0.02 | 0.1 | 10.2 |
| Comparative Example 2 | 0.2 | 10.0 | GF | 6 | 13 | 90.0 | 11 | 11 | 0.2 | 0.02 | 0.1 | 10.2 |
| Comparative Example 3 | 0.2 | 70.0 | GF | 70 | 13 | 30.0 | 11 | 11 | 0.2 | 0.02 | 0.1 | 10.2 |
| Comparative Example 4 | 0.2 | 70.0 | GF | 2 | 6 | 30.0 | — | — | 0.2 | 0.02 | 0.1 | 10.2 |
| Example 8 | 5 mm/ 10 μm*1 | 70.0 | GF | 6 | 13 | 30.0 | 11 | 11 | 0.2 | 0.02 | 1 | 10.2 |
| Example 9 | 10 mm/ 1 μm*1 | 70.0 | GF | 6 | 13 | 30.0 | 11 | 11 | 0.2 | 0.02 | 1 | 10.2 |
| Example 10 | 30 mm/ 400 μm*1 | 70.0 | GF | 6 | 13 | 30.0 | 11 | 11 | 0.2 | 0.02 | 1 | 10.2 |
| Comparative Example 5 | 0.03 | 70.0 | GF | 6 | 13 | 30.0 | 11 | 11 | 0.2 | 0.02 | 1 | 10.2 |
| Comparative Example 6 | 0.2 | 70.0 | GF | 6 | 13 | 30.0 | 11 | 11 | 0.2 | 0.02 | 1 | 150.2 |
| Example 11 | 0.2 | 66.7 | GF | 6 | 13 | 33.3 | 11 | 11 | 0.2 | 0.02 | 1 | 10.2 |
| Example 12 | 0.2 | 66.7 | GF | 2 | 6 | 33.3 | 11 | 11 | 0.2 | 0.02 | 1 | 10.2 |

*1 Fiber length/fiber diameter is represented instead of bulk density.
*2 Glass fiber.
*3 based on 100 parts by weight of the total amount of SPS and fibrous filler

TABLE 2

| No. | Dielectric Constant | Dielectric dissipation factor (%) | Coefficient of size variation a and b | Coefficient of size variation a and c | Coefficient of size variation thickness | Appearance | Molding ability |
|---|---|---|---|---|---|---|---|
| Example 1 | 2.9 | 0.001> | 0.01 | 0.02 | 0.01> | good | good |
| Example 2 | 2.6 | 0.001> | 0.03 | 0.02 | 0.01> | good | good |
| Example 3 | 3.2 | 0.001> | 0.01> | 0.01> | 0.01> | good | good |
| Example 4 | 2.9 | 0.001> | 0.02 | 0.02 | 0.01> | good | good |
| Example 5 | 2.9 | 0.001> | 0.02 | 0.02 | 0.01> | good | good |
| Example 6 | 2.9 | 0.001> | 0.01 | 0.01 | 0.01> | good | good |
| Example 7 | 2.9 | 0.001> | 0.01 | 0.02 | 0.01> | good | good |
| Comparative Example 1 | 2.6 | 0.001> | 0.05 | 0.06 | 0.02 | good | good |
| Comparative Example 2 | — | — | — | — | — | — | *1 |
| Comparative | — | — | — | — | — | — | *2 |

TABLE 2-continued

| No. | Dielectric Constant | Dielectric dissipation factor (%) | Coefficient of size variation a and b | a and c | thickness | Appearance | Molding ability |
|---|---|---|---|---|---|---|---|
| Example 3 |  |  |  |  |  |  | *3 |
| Comparative Example 4 | — | — | — | — | — | — |  |
| Example 8 | 2.9 | 0.001> | 0.01 | 0.01 | 0.01> | good | good |
| Example 9 | 2.9 | 0.001> | 0.01 | 0.02 | 0.01> | good | good |
| Example 10 | 2.9 | 0.001> | 0.02 | 0.02 | 0.01> | good | good |
| Comparative Example 5 | — | — | — | — | — | — | *4 |
| Comparative Example 6 | — | — | — | — | — | — | *5 |
| Example 11 | 2.9 | 0.001> | 0.02 | 0.01 | 0.01> | good | good |
| Example 12 | 2.9 | 0.001> | 0.02 | 0.02 | 0.01> | good | good |

*1: failing in press molding
*2: impossible to disperse homogeneously in water
*3: impossible to keep the shape of sheet
*4: SPS powder floating on the surface of water and failing in homogeneous dispersion
*5: failing in homogeneous dispersion even with vigorous stirring because of excessive amount of solids

TABLE 3

|  | Example 13 | Example 14 | Example 15 | Comparative Example 7 |
|---|---|---|---|---|
| SPS Staple | 5 mm/ 10 μm | 10 mm/ 1 μm | 30 mm/ 400 μm | 5 mm/ 10 μm |
| Thickness of sheet (mm) | 1.2 | 0.03 | 3.5 | 10 |

TABLE 4

|  | Example 13 | Example 14 | Example 15 | Comparative Example 7 |
|---|---|---|---|---|
| Dielectric Constant | 2.9 | 2.9 | 2.9 | 2.9 |
| Dielectric dissipation factor (%) | 0.001> | 0.001> | 0.001> | 0.001> |
| Flexural test | not folded | not folded | not folded | breakage |
| Molding ability | good | good | good | good |

TABLE 5

| No. | SPS Density (g/cm³) | SPS Loads (wt %) | Fibrous filler Kind | Length (mm) | Diameter (μm) | Loads (wt %) | Binder Styrene-butadiene type (part by weight) | Binding fiber Synthetic polyethylene pulp (part by weight) | Agglomerating agent Aluminum sulfate concn. (g/l) | Dispersing agent Amine type cation concn. (g/l) | Coupling agent γ-Aminopropyltriethoxysilane concn. (g/l) | solid concentration concn. (g/l) |
|---|---|---|---|---|---|---|---|---|---|---|---|---|
| Example 16 | 0.2 | 66.7 | GF*² | 6 | 13 | 33.3 | 11 | 11 | 0.2 | 0.02 | 0.1 | 10.2 |
| Example 17 | 0.2 | 90.0 | GF | 6 | 13 | 10.0 | 11 | 11 | 0.2 | 0.02 | 0.1 | 10.2 |
| Example 18 | 0.2 | 50.0 | GF | 6 | 13 | 50.0 | 11 | 11 | 0.2 | 0.02 | 0.1 | 10.2 |
| Example 19 | 0.2 | 70.0 | GF | 2 | 6 | 30.0 | 5 | — | 0.2 | 0.02 | 0.1 | 10.2 |
| Example 20 | 0.2 | 70.0 | GF | 30 | 13 | 30.0 | 11 | 11 | 0.2 | 0.02 | 0.1 | 10.2 |
| Example 21 | 0.4 | 70.0 | GF | 6 | 13 | 30.0 | 11 | 11 | 0.2 | 0.02 | 0.1 | 10.2 |
| Example 22 | 0.6 | 70.0 | GF | 6 | 13 | 30.0 | 11 | 11 | 0.2 | 0.02 | 0.1 | 10.2 |
| Comparative Example 8 | 0.2 | 98.0 | GF | 2 | 6 | 2.0 | 11 | 11 | 0.2 | 0.02 | 0.1 | 10.2 |
| Comparative Example 9 | 0.2 | 10.0 | GF | 6 | 13 | 90.0 | 11 | 11 | 0.2 | 0.02 | 0.1 | 10.2 |
| Comparative Example 10 | 0.2 | 70.0 | GF | 70 | 13 | 30.0 | 11 | 11 | 0.2 | 0.02 | 0.1 | 10.2 |
| Comparative Example 11 | 0.2 | 70.0 | GF | 0.5 | 13 | 30.0 | 11 | 11 | 0.2 | 0.02 | 0.1 | 10.2 |
| Comparative Example 12 | 0.2 | 70.0 | GF | 2 | 6 | 30.0 | — | — | 0.2 | 0.02 | 0.1 | 10.2 |
| Example 23 | 5 mm/ 10 μm*¹ | 70.0 | GF | 6 | 13 | 30.0 | 11 | 11 | 0.2 | 0.02 | 0.1 | 10.2 |
| Example 24 | 10 mm/ 1 μm*¹ | 70.0 | GF | 6 | 13 | 30.0 | 11 | 11 | 0.2 | 0.02 | 0.1 | 10.2 |
| Example 25 | 30 mm/ 400 μm*¹ | 70.0 | GF | 6 | 13 | 30.0 | 11 | 11 | 0.2 | 0.02 | 0.1 | 10.2 |
| Comparative Example 13 | 0.03 | 70.0 | GF | 6 | 13 | 30.0 | 11 | 11 | 0.2 | 0.02 | 0.1 | 10.2 |
| Comparative Example 14 | 0.2 | 70.0 | GF | 6 | 13 | 30.0 | 11 | 11 | 0.2 | 0.02 | 0.1 | 150.2 |
| Example 26 | 0.2 | 66.7 | GF | 6 | 13 | 33.3 | 11 | 11 | 0.2 | 0.02 | 0.1 | 10.2 |
| Example 27 | 0.2 | 66.7 | GF | 6 | 13 | 33.3 | 11 | 11 | 0.2 | 0.02 | 0.1 | 10.2 |

*¹Fiber length/fiber diameter is represented instead of bulk density.
²Glass fiber.

TABLE 6

| No. | Flexural strength (kg/cm²) | Flexural modulus (kg/cm²) | Izod impact (notched) (kg·cm/cm) | Heat distortion temperature (load: 4.6 kg/cm²) (°C.) | Appearance | Molding ability |
|---|---|---|---|---|---|---|
| Example 16 | 1,580 | 71,800 | 54 | 260 | good | good |
| Example 17 | 1,090 | 58,000 | 12 | 253 | good | good |
| Example 18 | 1,740 | 97,000 | 76 | 268 | good | good |
| Example 19 | 1,490 | 70,500 | 31 | 258 | good | good |
| Example 20 | 1,610 | 71,800 | 69 | 264 | good | good |
| Example 21 | 1,570 | 71,500 | 58 | 262 | good | good |
| Example 22 | 1,540 | 70,900 | 55 | 260 | good | good |
| Comparative Example 8 | 810 | 38,000 | 2 | 200 | good | good |
| Comparative Example 9 | — | — | — | — | — | *1 |
| Comparative Example 10 | — | — | — | — | — | *2 |
| Comparative Example 11 | 1,050 | 68,000 | 4 | 247 | good | good |
| Comparative Example 12 | — | — | — | — | — | *3 |
| Example 23 | 1,590 | 72,600 | 52 | 259 | good | good |
| Example 24 | 1,600 | 72,800 | 58 | 263 | good | good |
| Example 25 | 1,570 | 71,200 | 49 | 258 | good | good |
| Comparative Example 13 | — | — | — | — | — | *4 |
| Comparative Example 14 | — | — | — | — | — | *5 |
| Example 26 | 1,570 | 71,400 | 56 | 261 | good | good |
| Example 27 | 1,530 | 71,700 | 57 | 262 | good | good |

*1 fail in press molding
*2 impossible to disperse homogeneously into water
*3 impossible to keep the shape of sheet
*4 SPS powder floating on the surface of water and failing in homogeneous dispersion
*5 failing in homogeneous dispersion even with vigorous stirring because of excessive amount of solids

TABLE 7

| | SPS | | Fibrous filler | | | | Flame retardant | Binder |
|---|---|---|---|---|---|---|---|---|
| No. | Density (g/cm³) | Loads (wt %) | Kind | Length (mm) | Diameter (μm) | Loads (wt %) | Flame retardant (part by weight)*3 | Antimony trioxide (part by weight)*3 | Styrene-butadiene type (part by weight)*3 |
| Example 28 | 0.2 | 66.7 | GF | 6 | 13 | 33.3 | 15.3*1 | 4 | 11 |
| Example 29 | 0.2 | 66.7 | GF | 6 | 13 | 33.3 | 15.3*2 | 4 | 11 |

| No. | Binding fiber Synthetic polyethylene pulp (part by weight)*3 | Agglomerating agent Aluminum sulfate concn. (g/l) | Dispersing agent Amine type cation concn. (g/l) | Coupling agent γ-Aminopropyl triethoxysilane silane concn. (g/l) | Solid concentration concn. (g/l) |
|---|---|---|---|---|---|
| Example 28 | 11 | 0.2 | 0.02 | 0.1 | 10.2 |
| Example 29 | 11 | 0.2 | 0.02 | 0.1 | 10.2 |

*1 SAYTEX BT-93. Ethylene bis(tetrabromophthalimide) produced by Ethyl Corp.
*2 PYRO-CHEK 68PB produced by Ferro Corp.: Poly(tribromostyrene)
*3 based on 100 parts by weight of the total amount of SPS and fibrous filler

TABLE 8

| No. | Dielectric Constant | Dielectric dissipation factor (%) | Coefficient of size variation a and b | a and c | thickness | Appearance | Molding ability | Flame retardance |
|---|---|---|---|---|---|---|---|---|
| Example 28 | 3.3 | 0.001 | 0.02 | 0.02 | 0.01> | good | good | 1/32" V-0 |
| Example 29 | 3.4 | 0.002 | 0.02 | 0.02 | 0.01> | good | good | 1/32" V-0 |

What is claimed is:

1. A process for producing a printed circuit board comprising the following steps conducted sequentially:
   (1) a step of dispersing in at least one medium selected from the of water and an organic solvent, the following components:
   (A) 95 to 20% by weight of a styrene polymer having a high degree of syndiotactic structure,
   (B) 5 to 80% by weight of a fibrous filler having a fiber length of 1 to 50 mm, and
   (C) 0.1 to 30 parts by weight of at least one of a binder and a binding fiber in proportion to 100 parts by weight of a total amount of said components (A) and (B), to make a slurry having a dispersed solids concentration of 0.5 to 100 g/l,
   (2) a sedimentation step of said dispersed solids in said slurry,
   (3) a step of removing at least one of said mediums of water and said organic solvent from said slurry by filtration and drying to form a residue, and molding said residue into a molded article
   (4) a step of melting with heating and pressure forming, said molded article, and
   (5) a step of providing a metal layer on said molded article to form said printed circuit board.

2. The process according to claim 1, wherein said styrene polymer having a syndiotactic structure is a racemic pentad having 30% or more syndiotacticity.

3. The process according to claim 1, wherein in said dispersion and slurry forming step (1) at least one of a sizing agent and a dispersing agent are added to said medium.

4. The process according to claim 1, wherein in said dispersion and slurry forming step (1) at least one of a sizing agent and a dispersing agent are added to said medium and said components (B), (A) and (C) are added in this sequence.

5. The process according to claim 1, wherein in said sedimentation step, an agglomerating agent is added to said slurry.

6. A process for producing a printed circuit board comprising the following steps conducted sequentially:
   (1) a step of dispersing in at least one group consisting of water and an organic solvent, the following components:
   (A) 95 to 20% by weight of a styrene polymer having a high degree of syndiotactic structure,
   (B) 5 to 80% by weight of a fibrous filler having a fiber length of 1 to 50 mm, and
   (C) 0.1 to 30 parts by weight of at least one of a binder and a binding fiber in proportion to 100 parts by weight of a total amount of said components (A) and (B), to make a slurry having a dispersed solids concentration of 0.5 to 100 g/l,
   (2) a sedimentation step of said dispersed solids in said slurry,
   (3) a step of removing at least one of said mediums of water and said organic solvent from said slurry by filtration and drying to form a residue and molding said residue,
   (4) a step of impregnating said molded residue with a thermosetting resin and thereafter curing said resin to form a molded article, and
   (5) a step of providing a metal layer on said molded article to form said printed circuit board.

7. The process according to claim 6, wherein an amount of said thermosetting resin impregnated into said molded residue is in a proportion of 0.1 to 50 parts by weight to 100 parts by weight of said total amount of said components (A) and (B).

* * * * *

UNITED STATES PATENT AND TRADEMARK OFFICE
CERTIFICATE OF CORRECTION

PATENT NO. : 5,127,158

DATED : July 7, 1992

INVENTOR(S) : Akikazu NAKANO

It is certified that error appears in the above-identified patent and that said Letters Patent is hereby corrected as shown below:

Column 19, line 60 (claim 1), before "of water" insert --group consisting--.

Column 21, line 20 (claim 6), before "group consisting" insert --medium selected from the--.

Signed and Sealed this

Thirtieth Day of August, 1994

Attest:

BRUCE LEHMAN

*Attesting Officer*     *Commissioner of Patents and Trademarks*